(12) United States Patent
Natsume et al.

(10) Patent No.: US 7,098,639 B2
(45) Date of Patent: Aug. 29, 2006

(54) DC-DC CONVERTER AND METHOD FOR CONTROLLING DC-DC CONVERTER

(75) Inventors: Masahiro Natsume, Kasugai (JP); Kyuichi Takimoto, Kasugai (JP); Hidekiyo Ozawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 243 days.

(21) Appl. No.: 10/716,401

(22) Filed: Nov. 20, 2003

(65) Prior Publication Data

US 2004/0100240 A1    May 27, 2004

(30) Foreign Application Priority Data

Nov. 22, 2002    (JP) ............................. 2002-338954

(51) Int. Cl.
*G05F 1/56* (2006.01)

(52) U.S. Cl. ................................................ 323/282

(58) Field of Classification Search ................ 323/282, 323/284, 285, 351
See application file for complete search history.

(56) References Cited

U.S. PATENT DOCUMENTS 6,127,814 A * 10/2000 Goder ......................... 323/282
6,204,648 B1 * 3/2001 Saeki et al. .................. 323/282
6,304,066 B1 * 10/2001 Wilcox et al. ............... 323/282
6,678,178 B1 * 1/2004 Lipcsei ......................... 363/98
2005/0017676 A1 * 1/2005 Takimoto et al. ........... 320/107

FOREIGN PATENT DOCUMENTS

| JP | 2000-069746 | 3/2000 |
|---|---|---|
| JP | 2000-184612 | 6/2000 |
| JP | 2000-197349 | 7/2000 |
| JP | 2001-352750 | 12/2001 |

* cited by examiner

*Primary Examiner*—Adolf Berhane
(74) *Attorney, Agent, or Firm*—Staas & Halsey LLP

(57) ABSTRACT

A method for controlling a DC-DC converter that achieves high conversion efficiency without using a linear regulator circuit. The DC-DC converter includes a main switching transistor, a first capacitor, a second capacitor, and a diode that is series-connected to the first capacitor. The series-connected diode and the first capacitor are connected between the source and drain of the main switching transistor. The second capacitor is connected in parallel to the first capacitor or disconnected from the first capacitor in synchronism with activation and inactivation of the main switching transistor to generate gate voltage for driving the main switching transistor.

17 Claims, 9 Drawing Sheets

US 7,098,639 B2

DC-DC CONVERTER AND METHOD FOR CONTROLLING DC-DC CONVERTER

CROSS-REFERENCE TO RELATED APPLICATIONS

This application is based upon and claims the benefit of priority from the prior Japanese Patent Application No. 2002-338954, filed on Nov. 22, 2002, the entire contents of which are incorporated herein by reference.

BACKGROUND OF THE INVENTION

The present invention relates to a DC-DC converter and a method for controlling a DC-DC converter.

In the prior art, electronic devices, such as a notebook computer or a game gadget, incorporates a plurality of semiconductor devices. To keep the operational voltage supplied to the semiconductor devices constant, a DC-DC converter is used to maintain constant battery voltage, which tends to fluctuate, by converting battery voltage to constant voltage (operational voltage) (e.g., Japanese Laid-Open Patent Publication Nos. 2000-69746, 2000-184612, and 2001-352750).

The conversion efficiency of DC-DC converters must be improved for electronic devices to be used more widely. This is because the conversion efficiency of a DC-DC converter determines the battery operation time of an electronic device. For example, in an electronic device of which power consumption is 1 Wh, when operating the electronic device with a 10 Wh battery, if the ideal conversion efficiency of the DC-DC converter is 100%, the operation time of the battery is ten hours. However, if the conversion efficiency is 50%, the battery operation time decreases to five hours.

In a switching regulator type DC-DC converter, the conversion efficiency is improved by employing synchronous rectification or by employing a switching transistor, such as an n-type field effect transistor (FET) as a main switching transistor (e.g., Japanese Laid-Open Patent Publication No. 2000-197349, pages 7–8, FIG. 8).

In synchronous rectification, an FET is used in lieu of a flywheel diode as a circuit for rectifying output in a DC-DC converter. Synchronous rectification decreases voltage drops and achieves high conversion efficiency. Synchronous rectification is necessary to achieve high conversion efficiency especially for a DC-DC converter having low output voltage.

Among switching regulator type DC-DC converters, a voltage drop type that converts high voltage to low voltage has a high conversion efficiency of 95% to 96%. A prior art example of a synchronous rectification voltage drop type DC-DC converter is shown in FIG. 1. The DC-DC converter 1 is incorporated in an electronic device (e.g., notebook personal computer) and converts input voltage from a battery (not shown) to an output voltage Vout, which is used to operate CPUs and their peripheral circuits.

The DC-DC converter 1 includes a control circuit 2 and a plurality of externally connected devices that are configured on a single chip of a semiconductor device. The control circuit 2 generates a first drive signal SG1, which is provided to the gate of a main switching transistor T1 (specifically, a p-type FET). The source of the transistor T1 is supplied with the input voltage Vin. The drain of the main switching transistor (hereafter referred to as main transistor) T1 is connected to the drain of a synchronous rectification transistor T2 (specifically, an n-type FET). The gate of the synchronous rectification transistor (hereafter referred to as rectifying transistor) T2 is provided with a second drive signal SG2 of the control circuit 2. The source of the transistor T2 is grounded.

The drain of the main transistor T1 is connected to an output terminal 3 via a choke coil L1. The output terminal is grounded via a smoothing capacitor C1. The drain of the main transistor T1 is further connected to the cathode of a flywheel diode D1, and the anode of the diode D1 is grounded.

The control circuit 2 includes voltage dividing resistors R1 and R2, an error amplifier 4, a triangular wave oscillator 5, a PWM comparator 6, and drive circuits 7a and 7b. Further, the control circuit 2 generates the first and second drive signals SG1 and SG2. The first and second drive signals SG1 and SG2 respectively control the operation of the transistors T1 and T2.

In the control circuit 2, the voltage dividing resistors R1 and R2 divide the output voltage Vout. The divisional voltage is supplied to the inverting input terminal of the error amplifier 4. The non-inverting input terminal of the error amplifier 4 is supplied with a reference voltage e1 (first reference voltage). The error amplifier 4 compares the divisional voltage, which corresponds to the output voltage Vout, to amplify the voltage difference between the divisional voltage and the reference voltage and generates an error output signal A1.

The error output signal A1 is provided to the non-inverting terminal of the PWM comparator 6. The inverting input terminal of the PWM comparator 6 is provided with a triangular wave signal, which has a predetermined cycle, from the triangular wave oscillator 5. The PWM comparator 6 compares the error output signal A1 with the triangular wave signal to generate a PWM output signal P1 having a predetermined duty ratio in accordance with the comparison result. The PWM output signal P1 controls the activation and inactivation of the main transistor T1 to maintain the output voltage Vout at a constant state.

FIG. 2 is a waveform diagram showing the operation of the control circuit 2. In the control circuit 2, the voltage fluctuation of the error output signal A1 is large when the difference between the divisional voltage and the reference voltage e1 is large and small when the voltage difference between the divisional voltage and the reference voltage e1 is small.

The PWM comparator 6 generates the PWM output signal P1 at a high level when the triangular wave signal is lower than the error output signal A1 and generates the PWM output signal P1 at a low level when the triangular wave signal is higher than the output signal A1. Accordingly, when the voltage of the error output signal A1 increases, the pulse width of the PWM output signal P1 increases (i.e., the pulse width during which the signal P1 is high).

The PWM output signal P1 is inverted by a drive circuit 7a (specifically, an inverter circuit) and provided to the gate of the main transistor T1 as the first drive signal SG1. Thus, when the pulse width of the PWM output signal P1 increases, the ON time of the transistor T1 increases. On the other hand, when the pulse width of the PWM output signal P1 decreases, the ON time of the transistor T1 decreases.

In the DC-DC converter 1, the PWM output signal P1 controls the activation and inactivation of the main transistor T1 so that the output voltage Vout becomes equal to the constant voltage set by the reference voltages e1 and the voltage dividing resistors R1 and R2.

The PWM comparator 6 generates an inverted PWM output signal P2 having a logic level that is inverted from the PWM output signal P1. That is, the output signals P1 and P2 are output as complementary signals from the PWM comparator 6. The inverted PWM output signal P2 is provided to the gate of the rectifying transistor T2 as the second drive signal SG2 via the drive circuit 7b.

Accordingly, the rectifying transistor T2 is inactivated when the main transistor T1 is activated, and the rectifying transistor T2 is activated when the main transistor T1 is inactivated. That is, the main transistor T1 and the rectifying transistor T2 are alternately activated by the first and second drive signals SG1 and SG2 provided from the control circuit 2.

The switching operation of the main transistor T1 smoothes output current of the main transistor T1 by means of the choke coil L1 and the smoothing capacitor C1. When the main transistor T1 is activated, the input voltage Vin is supplied to an LC circuit (i.e., smoothing circuit configured by the choke coil L1 and the smoothing capacitor C1) via the transistor T1. When the main transistor T1 is inactivated, a current path is configured with the flywheel diode T1. In this state, the energy stored in the choke coil L1 during activation of the main transistor T1 is released to the output terminal 3.

The output voltage of the output terminal 3 is represented by the next equation.

$$Vout = Vin \times Ton/(Ton+Toff)$$

In the equation, Ton represents the period during which the transistor T1 is activated (the activation time of the PWM output signal P1 in FIG. 2) and Toff represents the period during which the transistor T1 is inactivated (the inactivation time of the output signal P1 in FIG. 2).

Accordingly, even if the input voltage Vin fluctuates due to reasons, such as battery drainage or the environmental conditions of the electronic device, the controlling of the duty cycle of the PWM output signal guarantees that the output voltage Vout is maintained at a constant voltage.

In the DC-DC converter 1, when the main transistor T1 is inactivated, the second drive signal SG2 activates the rectifying transistor T2 and the voltage drop of the flywheel diode D1 in the forward direction is clamped. This decreases voltage drop and improves the smoothing efficiency.

In the DC-DC converter 1, a p-type FET is used as the main transistor T1. However, if an n-type FET is used as the main transistor T1 like in a DC-DC converter 1a as shown in FIG. 3, the ON resistance of the main transistor T1 decreases and reduces power loss.

When using an n-type FET as the main transistor T1, the first drive signal SG1 for driving the transistor T1 must have a voltage that is greater than the input voltage Vin. Thus, in the DC-DC converter 1a of FIG. 3, when the main transistor T1 is activated and inactivated, a charge pump generates the drive voltage of the transistor T1 by utilizing the fluctuation of the input voltage Vin between the source potential and ground potential of the main transistor T1.

More specifically, the PWM output signal P1 is provided via a drive circuit 8a to the gate of the main transistor T1. The inverted PWM output signal P2 is provided via a drive circuit 8b to the gate of the rectifying transistor T2 as the second drive signal SG2.

A series-connected circuit configured by a diode D2 and a capacitor C3 is connected between the drain and source of the main transistor T1. The cathode of the diode D22 is connected to the capacitor C3. A connection node between the diode D2 and the capacitor C3 is connected to a power supply terminal of the drive circuit 8a. The anode of the diode D2 is connected to a power supply terminal of the drive circuit 8b. Further, the anode of the diode D2 is connected to the ground via a capacitor C2.

In the DC-DC converter 1a, when the main transistor T1 is inactivated and the rectifying transistor T2 is activated, the source potential of the main transistor T1 is the ground potential. In this state, current flows via the diode D2 to the capacitor C3. The capacitor C3 is charged until its voltage becomes equal to the input voltage Vin. Then, the charged voltage of the capacitor C3 is used to output the drive signal SG1 from the drive circuit 8a and activate the main transistor T1.

When the main transistor T1 is activated, the source potential of the transistor T1 is increased to the input voltage Vin. In this state, the capacitor C3 is connected to the source of the transistor T1. Thus, the voltage supplied from the capacitor C3 to the drive circuit 8a increases and becomes greater than the input voltage Vin. Even if the source potential of the transistor T1 increases, the voltage of the first drive signal SG1 for the source potential does not change and is equal to the input voltage Vin.

The first drive signal SG1 drives the main transistor T1. In this state, the capacitor C3 has a voltage that is greater than the input voltage Vin. Further, the diode D2 functions as a reversed current prevention circuit for preventing charges of the capacitor C3 from reversely flowing towards the side of the input voltage Vin (battery voltage).

The input voltage Vin drives the main transistor T1 of the DC-DC converter 1a. In this case, power loss resulting from the gate capacitance of the main transistor T1 is represented by the next equation.

$$PW = \tfrac{1}{2} \times f \times C \times Vin^2$$

In the equation, f represents the switching frequency, and C represents the gate capacitance of the main switching transistor T1. Further, ^ indicates that Vin is to be raised to an exponential power (2 in this case).

The power loss PW resulting from the gate capacitance C of the transistor T1 is proportional to the switching frequency f and is proportional to the square of the input voltage Vin. Thus, a linear regulator is employed to decrease the input voltage Vin to an appropriate voltage value and use the decreased input voltage Vin in order to reduce power loss PW.

FIG. 4 shows a prior art example of a DC-DC converter 1b using a linear regulator 9. In the DC-DC converter 1b, the linear regulator 9 is provided with the input voltage Vin. The output terminal of the linear regulator 9 is connected to the anode of the diode D2 and to the power supply terminal of the drive circuit 8b.

However, when the output is increased and the frequency is raised in the DC-DC converter 1b, the gate current flowing to the gate of the main transistor T1 increases. This produces heat in the linear regulator 9.

To reduce power loss, as shown by the broken line in the DC-DC converter 1b of FIG. 4, a diode D3 may be added between the linear regulator 9 and the output terminal 3. In this case, when the DC-DC converter 1b is activated, the output voltage of the linear regulator 9 is used as the drive voltage. When the output voltage Vout is output from the output terminal 3 at a constant voltage, the output voltage Vout is used as the drive voltage. This is preferable for reducing the power loss PW when the output voltage Vout of the DC-DC converter 1b is the optimal voltage value for the drive voltage of the main transistor T1.

In the DC-DC converter, the voltage dividing resistors R1 and R2 are arranged outside the control circuit 2 as externally connected devices. The resistance of each of the resistors R1 and R2 is altered to set the output voltage Vout as desired. In this case, the output voltage Vout is not necessarily the optimal value for the drive voltage of the main transistor T1. Thus, the technology of FIG. 4 in which the diode D3 is added cannot be employed.

In recent years, the power efficiency of semiconductor devices incorporated in electronic devices has increased. Further, the voltage of the DC-DC converter is decreasing year by year. Thus, the output voltage of the DC-DC converter cannot be used directly as the drive voltage of the main transistor T1.

SUMMARY OF THE INVENTION

One aspect of the present invention is a method for controlling a DC-DC converter. The DC-DC converter includes a first capacitor, a second capacitor, a diode connected in series with the first capacitor, and a main switching transistor having a source, a gate, and a drain. The method includes connecting the diode and the first capacitor that are connected in series with each other between the source and the drain of the main switching transistor, activating and inactivating the main switching transistor, generating gate voltage to drive the main switching transistor by connecting the second capacitor in parallel to the first capacitor or by disconnecting the second capacitor from the first capacitor in synchronism with the activation and inactivation of the main switching transistor, and switching the main switching transistor with the gate voltage.

Another aspect of the present invention is a DC-DC converter including a main switching transistor having a source, a gate, and a drain. The DC-DC converter also includes a gate voltage generation circuit connected to the main switching transistor to generate gate voltage for driving the main switching transistor. The gate voltage generation circuit includes a series-connected circuit configured by a diode and a first capacitor connected between the source and the drain of the main switching transistor, a switch circuit connected to the first capacitor, and a second capacitor connected in parallel to the first capacitor via the switch circuit. The gate voltage generation circuit generates the gate voltage by connecting or disconnecting the first and second capacitors in synchronism with activation and inactivation of the main switching transistor.

A further aspect of the present invention is a DC-DC converter for converting an input voltage to a desired voltage. The DC-DC converter includes a main switching transistor having a source, a gate, and a drain. A first capacitor and a second capacitor are connected between the source and the drain of the main switching transistor to divide the input voltage. A drive voltage generation circuit generates drive voltage for the main switching transistor with the input voltage divided by the first capacitor and the second capacitor.

A further aspect of the present invention is a DC-DC converter for converting an input voltage to a desired voltage. The DC-DC converter includes a main switching transistor having a source, a gate, and a drain. A first capacitor is connected between the source and the drain of the main switching transistor to generate first charged voltage with the input voltage. A second capacitor is selectively connected to the first capacitor and charged by the first charged voltage to generate second charged voltage. A drive voltage generation circuit generates drive voltage for the main switching transistor with the second charged voltage.

A further aspect of the present invention is a semiconductor device for a DC-DC converter. The DC-DC converter includes a main switching transistor having a source, a gate, and a drain. A series-connected circuit is configured by a diode and a first capacitor connected between the source and the drain of the main switching circuit. A second capacitor is connected to the first capacitor. The semiconductor device includes a switch circuit connected between the first capacitor and the second capacitor. The switch circuit connects or disconnects the first and second capacitors in synchronism with activation and inactivation of the main switching transistor to generate gate voltage for the main switching transistor. A drive signal generation circuit is connected to the switch circuit to generate a drive signal of the main switching transistor.

A further aspect of the present invention is a semiconductor device for a DC-DC converter. The DC-DC converter includes a series-connected circuit configured by a diode and a first capacitor. A second capacitor is connected to the first capacitor. The semiconductor device includes a main switching transistor connected to the first capacitor and the second capacitor and having a source, a gate, and a drain. The series-connected circuit is connected between the source and the drain of the main switching transistor. A switch circuit is connected between the first capacitor and the second capacitor, the switch circuit connecting or disconnecting the first and second capacitors in synchronism with activation and inactivation of the main switching transistor to generate gate voltage for the main switching transistor.

A further aspect of the present invention is an electronic device including a DC-DC converter. The DC-DC converter includes a main switching transistor having a source, a gate, and a drain. A gate voltage generation circuit is connected to the main switching transistor to generate gate voltage for driving the main switching transistor. The gate voltage generation circuit includes a series-connected circuit configured by a diode and a first capacitor connected between the source and the drain of the main switching transistor. A switch circuit is connected to the first capacitor. A second capacitor is connected in parallel to the first capacitor via the switch circuit. The gate voltage generation circuit generates the gate voltage by connecting or disconnecting the first and second capacitors in synchronism with activation and inactivation of the main switching transistor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
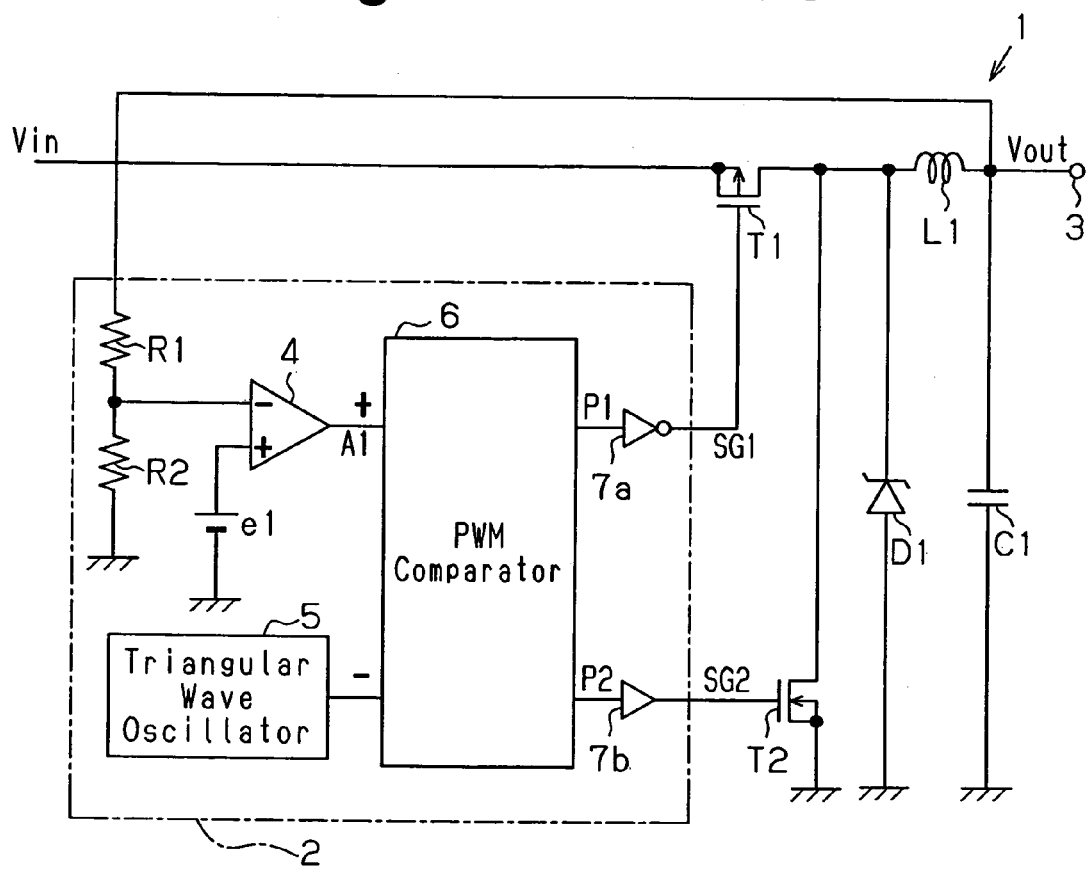
FIG. 1 is a schematic circuit diagram of the DC-DC converter in the prior art.
Figure 2:
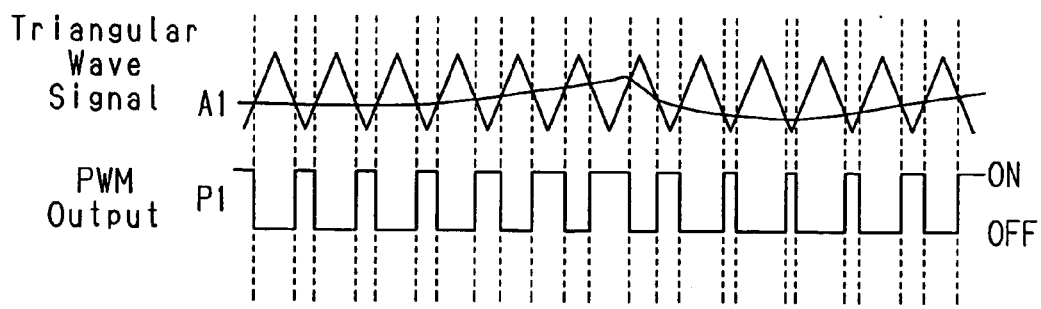
FIG. 2 is a waveform diagram showing the operation of a control circuit in the DC-DC converter of FIG. 1.

In the drawings, like numerals are used for like elements throughout.

Figure 5:
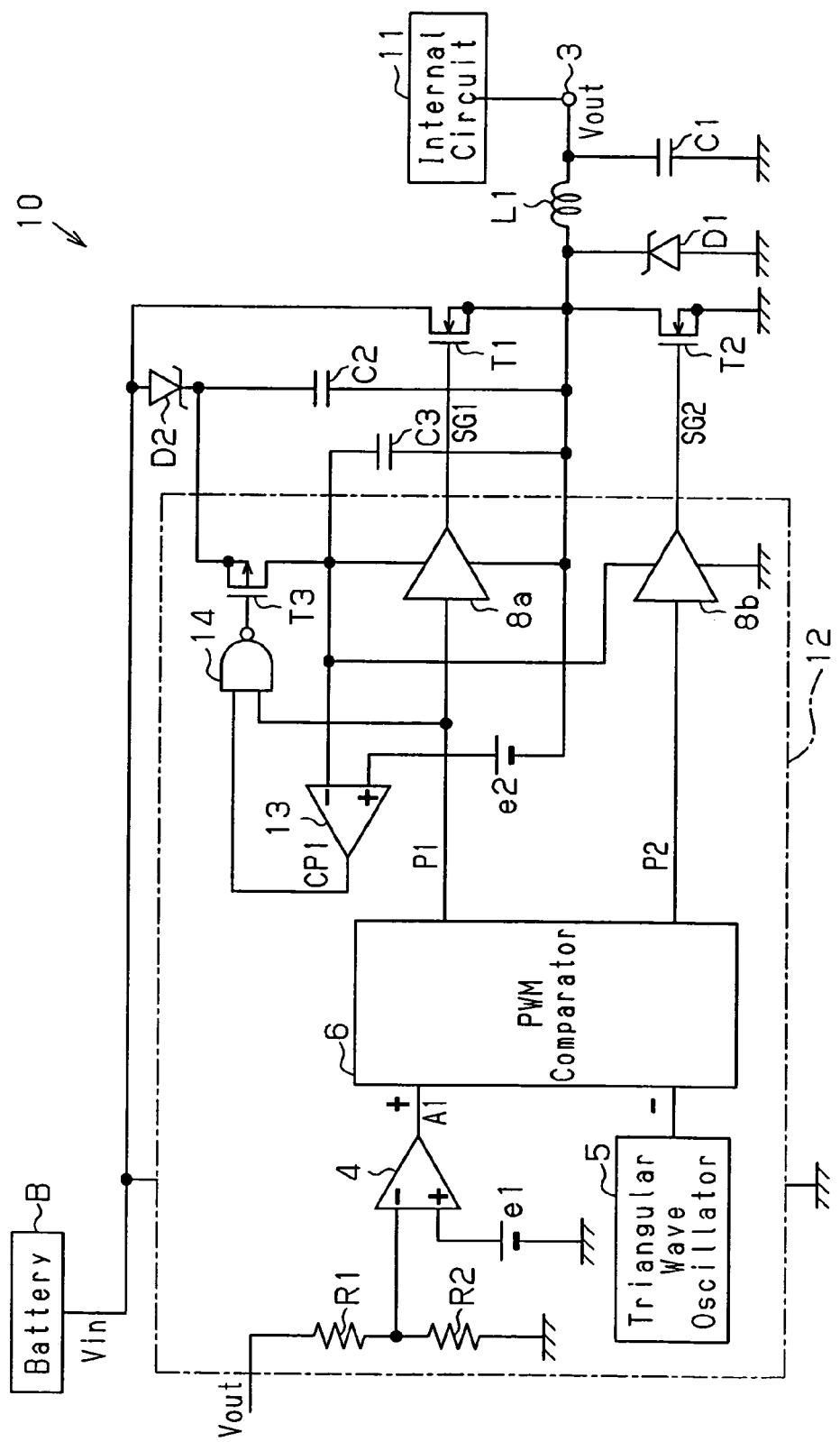
FIG. 5 is a schematic circuit diagram of a DC-DC converter according to a first embodiment of the present invention.

FIG. 5 is a schematic circuit diagram of a DC-DC converter 10 according to a first embodiment of the present invention. The DC-DC converter 10 is incorporated in an electronic device (e.g., notebook personal computer) to convert input voltage Vin from a battery B to an output voltage Vout. The output voltage Vout is a constant voltage that operates an internal circuit 11, such as a central processing unit (CPU).

The DC-DC converter 10 includes a main switching transistor (hereafter referred to as main transistor) T1, a synchronous rectification transistor (hereafter referred to as rectifying transistor) T2, a choke coil L1, a flywheel diode D1, a smoothing capacitor C1, a diode D2, and capacitors C2 and C3, which are externally connected to a control circuit 12 configured on a single chip of a semiconductor device. The main transistor T1 and the rectifying transistor T2 are preferably n-type FETs.

The main transistor T1 and the rectifying transistor T2 are connected in series. The drain of the main transistor T1 is supplied with the input voltage Vin from the battery B. The source of the main transistor T1 is connected to the drain of the rectifying transistor T2, and the source of the rectifying transistor T2 is grounded.

The source of the main transistor T1, or the connection node of the transistors T1 and T2, is connected to an output terminal 3 via a smoothing circuit, which is configured by the choke coil L1 and the smoothing capacitor C1. The connection node of the transistors T1 and T2 is further connected to the cathode of the flywheel diode D1. The anode of the diode D1 is grounded.

A series-connected circuit configured by the diode D2 and the capacitor C2 is connected between the source and drain of the main transistor T1. The anode of the diode D2 is connected to the drain of the main transistor T1. The cathode of the diode D2 is connected to the capacitor C2. The source of the main transistor T1 is connected to a control circuit 12 via the capacitor C3.

Figure 3:
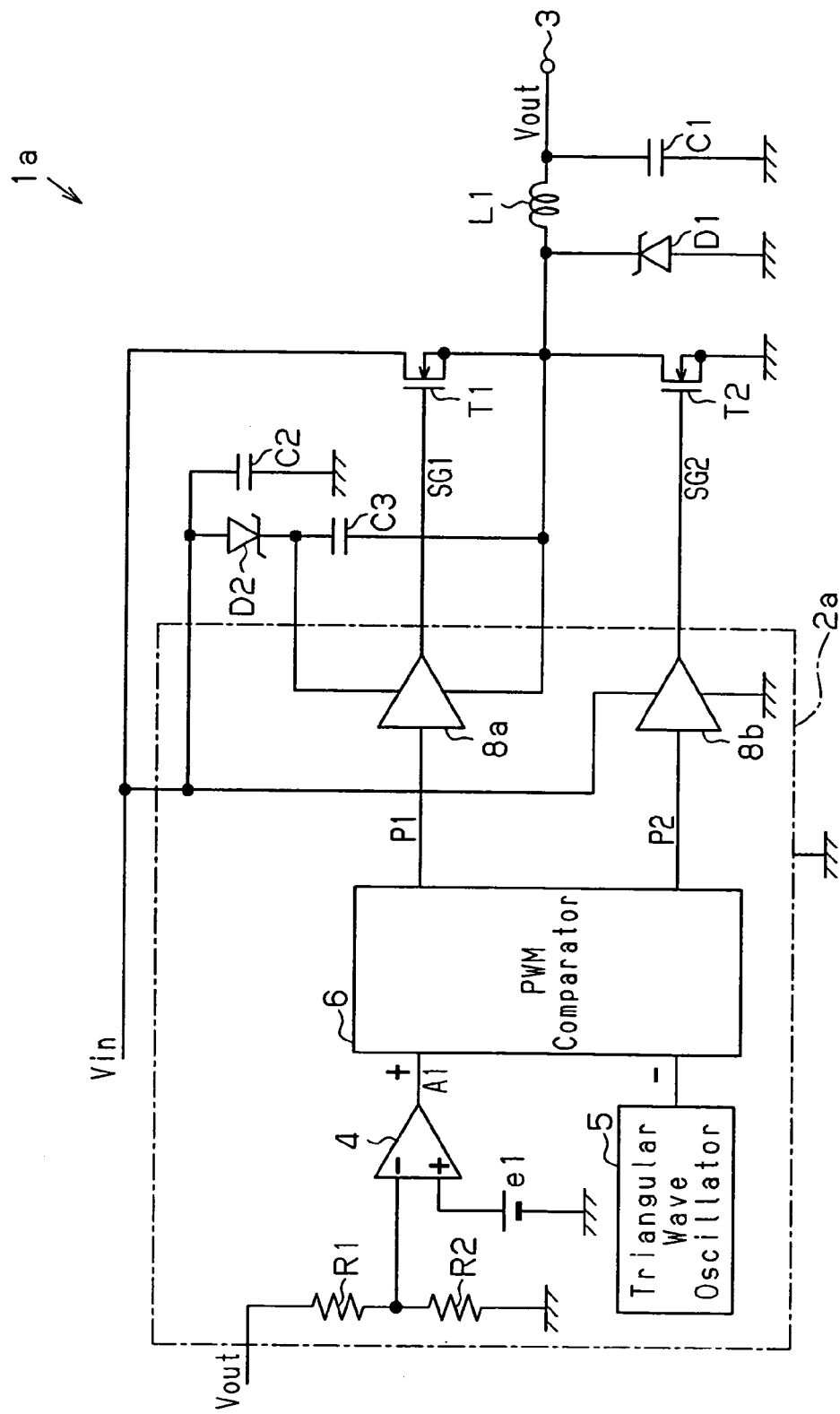
FIG. 3 is a schematic circuit diagram of another DC-DC converter in the prior art.
Figure 4:
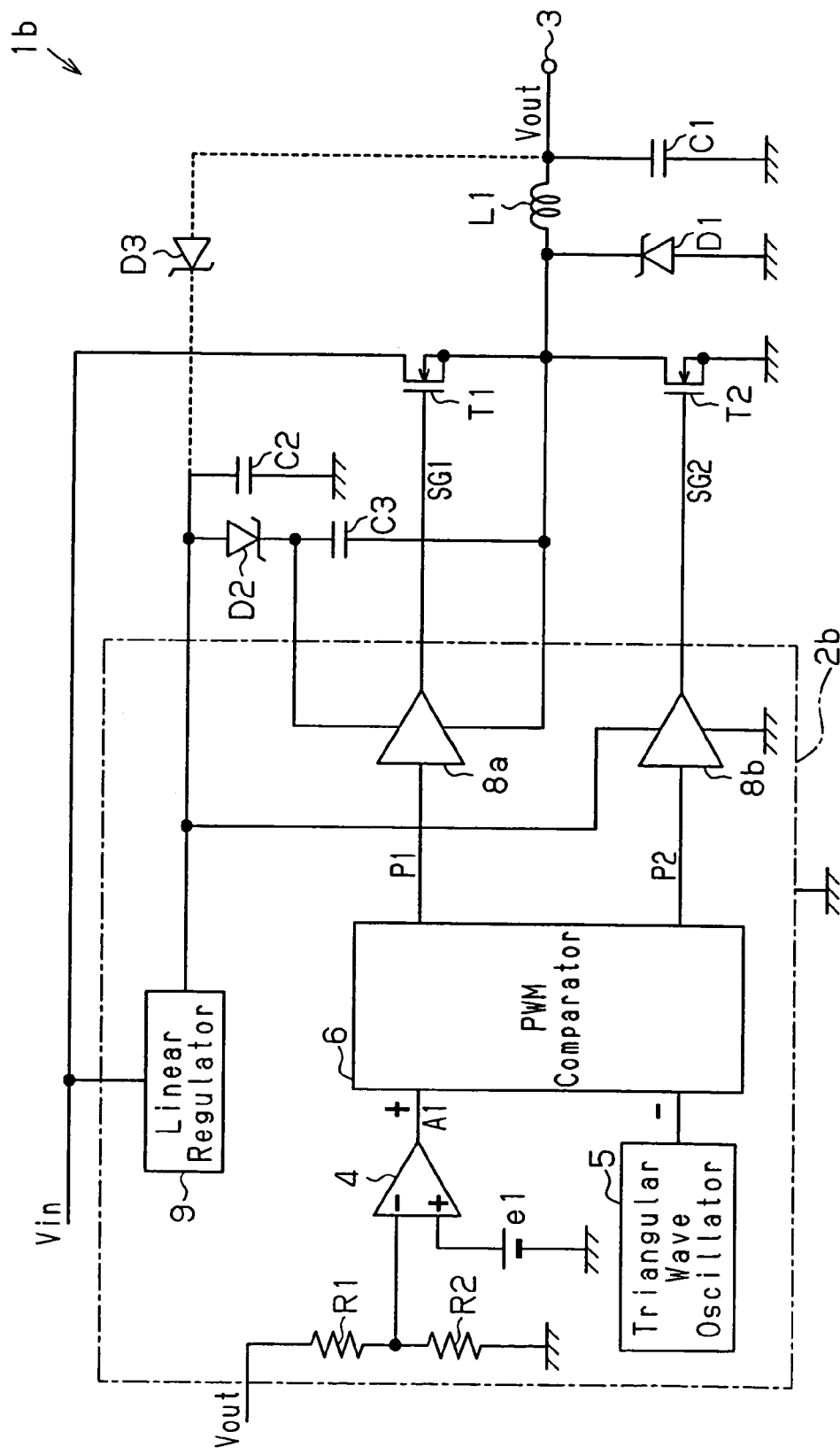
FIG. 4 is a schematic circuit diagram of a further DC-DC converter in the prior art.

The control circuit 12 includes voltage dividing resistors R1 and R2, an error amplifier 4, a triangular wave oscillator 5, a PWM comparator 6, drive circuits 8a and 8b, a transistor (switch circuit) T3, a voltage comparator 13, and a NAND circuit 14. Description will be centered on points differing from the prior art control circuit 2a of FIG. 3.

The source of the transistor (specifically, a p-type FET) T3 is connected to a connection node of the cathode of the capacitor C2 and the diode D2. The drain of the transistor T3 is connected to the capacitor C3. When the transistor T3 is activated, the capacitor C2 is connected in parallel to the capacitor C3. The drain of the transistor T3 is further connected to the power supply terminal of the drive circuit 8a and to the inverting input terminal of the voltage comparator 13. Accordingly, the inverting input terminal of the voltage comparator 13 is supplied with the voltage of the capacitor C3 (drive voltage of the drive circuit 8a). The non-inverting input terminal of the voltage comparator 13 is supplied with a second reference voltage e2.

The voltage comparator 13 is a circuit for monitoring the voltage of the capacitor C3. The voltage comparator 13 compares the voltage of the capacitor C3 with the second reference voltage e2, generates a comparison output signal CP1 at a high level when the voltage of the capacitor C3 is low, and generates the comparison output signal CP1 at a low level when the voltage of the capacitor C3 is high. The comparison output signal is provided to one of the input terminals of the NAND circuit 14, and the other one of the input terminals of the NAND circuit is provided with a PWM output signal P1. A NAND output signal of the NAND circuit 14 is provided to the gate of the transistor T3.

The NAND circuit 14 generates the NAND output signal at a low level when the PWM output signal P1 is high and the comparison output signal CP1 is high. The low NAND output signal activates the transistor T3. This connects the capacitors C2 and C3 in parallel to each other. The NAND circuit 14 generates the NAND output signal at a high level when the PWM output signal P1 or the comparison output signal CP1 is low. The high NAND output signal inactivates the transistor T3 and disconnects the capacitors C2 and c3 from each other.

In the first embodiment, a gate (drive) voltage generation circuit includes the diode D2, the capacitors C2 and C3, the transistor T3, the voltage comparator 13, and the NAND circuit 14.

The operation of the DC-DC converter 10 will now be discussed. When the main transistor T1 is inactivated and the rectifying transistor T2 is activated (i.e., when the PWM output signal P1 is low and the inverted PWM output signal P2 is high), the source potential of the main transistor T1 changes to the ground potential. In this state, the capacitor C2 is charged via the diode D2, and the voltage of the capacitor C2 is increased to the input voltage Vin. Since the PWM output signal P1 is low, the NAND circuit 14 generates the NAND output signal at a high level. This inactivates the transistor T3. Thus, the capacitor C2 and the capacitor C3 are disconnected from each other, and the capacitor C3 is not charged.

Then, when the rectifying transistor T2 is inactivated and the main transistor T1 is activated, the source potential of the main transistor T1 is increased to the input voltage Vin. Thus, the diode D2 enters a reversed bias state. This inactivates the diode D2 and stops charging the capacitor C2.

In this state, the PWM output signal P1 is high. Thus, when the voltage of the capacitor C3 is lower than the reference voltage e2 and the comparison output signal CP1 is high, the NAND circuit 14 generates the NAND signal at a low level to activate the transistor T3. This connects the capacitor C3 to the capacitor C2, and the capacitor C2 charges the capacitor C3.

When the voltage of the capacitor C3 is greater than the reference voltage e2, the comparison output signal is low. Thus, the NAND circuit 14 generates the NAND output signal at a high level to inactivate the transistor T3. In this state, the capacitor C2 and the capacitor C3 remain disconnected. Thus, the capacitor C3 is not charged.

Figure 6:
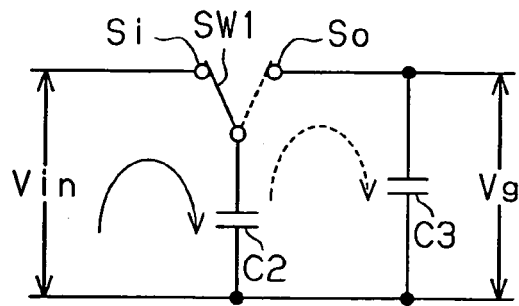
FIGS. 6 and 7 are equivalent circuit diagrams illustrating the operation of the DC-DC converter shown in FIG. 5.

The gate voltage Vg for driving the main transistor T1, in other words, the operation principle for generating the drive voltage supplied from the capacitor C3 to the drive circuit 8a will now be discussed with reference to the equivalent circuit of FIG. 6. In FIG. 6, switch SW1 corresponds to the diode D2 and the transistor T3 of FIG. 5.

As shown in FIG. 6, when the switch SW1 is connected to an input terminal Si, the charge Q stored in the capacitor C2 is represented by the following equation.

$$Q = Ca2 \times Vin$$

In the equation, Ca2 represents the capacitance of the capacitor C2.

When the switch SW1 is connected to the output terminal So, some of the charge Q stored in the capacitor C2 is moved to the capacitor C3. In this state, the total amount of the charge Q does not change. Thus, the next equation is satisfied.

$$Q = (Ca2 + Ca3) \times Vg$$

In the equation, Ca3 represents the capacitance of the capacitor C3.

$$Ca2 \times Vin = (Ca2 + Ca3) \times Vg$$

$$Vg = Ca2/(Ca2 + Ca3) \times Vin$$

In this manner, the difference between the capacitance Ca2 of the capacitor C2 connected to the input side and the capacitance Ca3 of the capacitor C3 connected to the output side is used to convert the input voltage Vin to the desired gate voltage Vg.

The average current flowing from the input side (capacitor C2) to the output side (capacitor C3) when switching the switch SW1 at a speed of frequency f (1/T) in the equivalent circuit of FIG. 6 will now be discussed.

The charge Q1 stored in the capacitor C2 when the switch SW1 is connected to the input terminal Si is represented in the next equation.

$$Q1 = Ca2 \times Vin$$

The charge Q2 stored in the capacitor C2 when the switch SW1 is connected to the output terminal So is represented in the next equation.

$$Q2 = Ca2 \times Vg$$

Accordingly, charge Q that is moved from the capacitor C2 to the capacitor C3 during the period of t seconds is represented in the next equation.

$$\begin{aligned} Q &= Q1 - Q2 \\ &= Ca2 \times Vin - Ca2 \times Vg \\ &= Ca2 \times (Vin - Vg) \end{aligned}$$

Thus, the average current I is obtained from the next equation.

$$I = Q/T = Ca2 \times (Vin - Vg)/T$$

In this manner, the capacitance Ca2 of the capacitor C2 connected to the input side enables the output current (the current supplied to the drive circuit 8a) to be adjusted to the desired value to reduce power consumption.

Figure 7A:
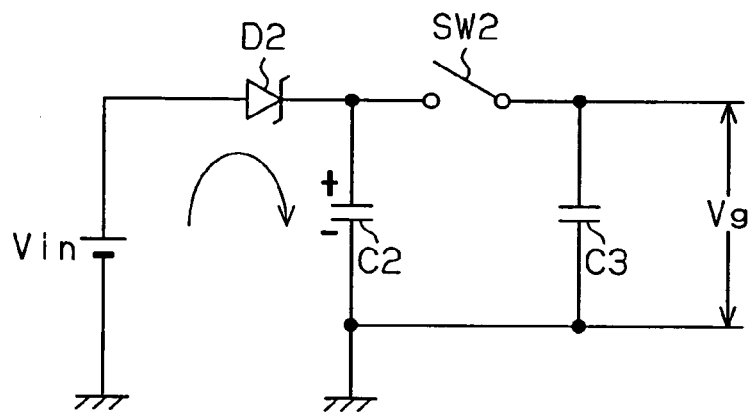
Figure 7B:
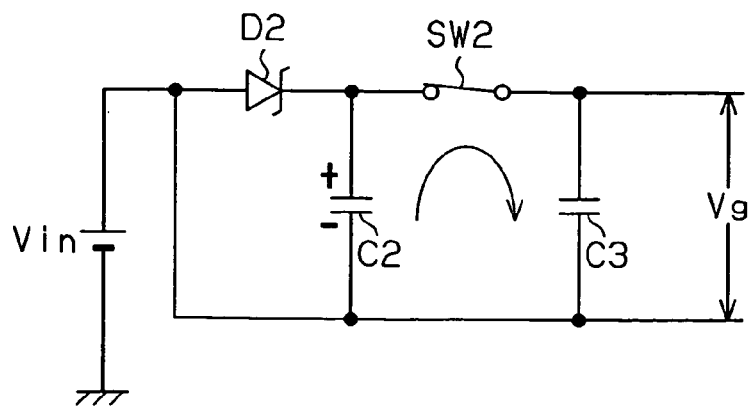

The operation of the DC-DC converter 10 will now be discussed with reference to the equivalent circuits shown in FIGS. 7(a) and 7(b). FIG. 7(a) shows the equivalent circuit in a state in which the main transistor T1 is inactivated and the rectifying circuit T2 is activated. FIG. 7(b) shows the equivalent circuit in a state in which the rectifying transistor T2 is activated and the rectifying circuit T2 is inactivated. In FIGS. 7(a) and 7(b), switch SW2 corresponds to the transistor T3.

In FIG. 7(a), the source potential at the main transistor T1 is the ground potential, and the capacitors C2 and C3 are grounded. Thus, the capacitor C2 is charged via the diode D2. In this state, the switch SW2 is inactivated and the capacitor C3 is disconnected from the entire circuit.

In FIG. 7(b), the source potential at the main transistor T1 is the input voltage Vin, and a reversed bias is applied to the diode D2. Thus, the capacitors C2 and C3 do not receive the input voltage Vin. Since the switch SW2 is activated and the capacitor C2 is connected in parallel to the capacitor C3, the capacitor C2 charges the capacitor C3.

The states of FIGS. 7(a) and 7(b) are repeated to charge the capacitor C3 to a predetermined voltage (reference voltage e2). During the charging, the voltage comparator 13 monitors the capacitor C3 to check that the voltage of the capacitor C3 does not become greater than necessary. When the voltage of the capacitor C3 increases and becomes equal to the reference voltage e2 or greater, the transistor T3 is inactivated to disable charging of the capacitor C3.

The DC-DC converter 10 of the first embodiment has the advantages described below.

(1) By dividing the input voltage Vin with the two capacitors C2 and C3, the optimal gate voltage Vg for driving the main transistor T1 is generated without using the linear regulator of the prior art. This increases the conversion efficiency of the DC-DC converter 10.

(2) The voltage comparator (voltage monitoring circuit) 13 monitors the voltage of the capacitor C3, which supplies the drive circuit 8a with drive voltage, and activates and inactivates the transistor (switch circuit) T3 in accordance with the voltage of the capacitor C3. This controls the voltage of the capacitor C3 to be included in the regulated range and generates the desired gate voltage Vg for driving the main transistor T1.

(3) The transistor T3, which generates the gate voltage Vg, the voltage comparator 13, and the NAND circuit 14 are incorporated in the control circuit 12, which is a single chip of a semiconductor device. The employment of the control circuit 12 enables the size of the DC-DC converter 10 to be reduced. This reduces the size of an electronic device using the DC-DC converter 10.

(4) When comparing an n-type FET and a p-type FET that have the same size, the ON resistance of the n-type FET is 42% less than that of the p-type FET. Accordingly, power loss resulting from the ON resistance is reduced when using the n-type FET as the main transistor T1.

(5) The increase in the conversion efficiency of the DC-DC converter 10 increases the battery life of an electronic device incorporating the DC-DC converter 10.

Figure 8:
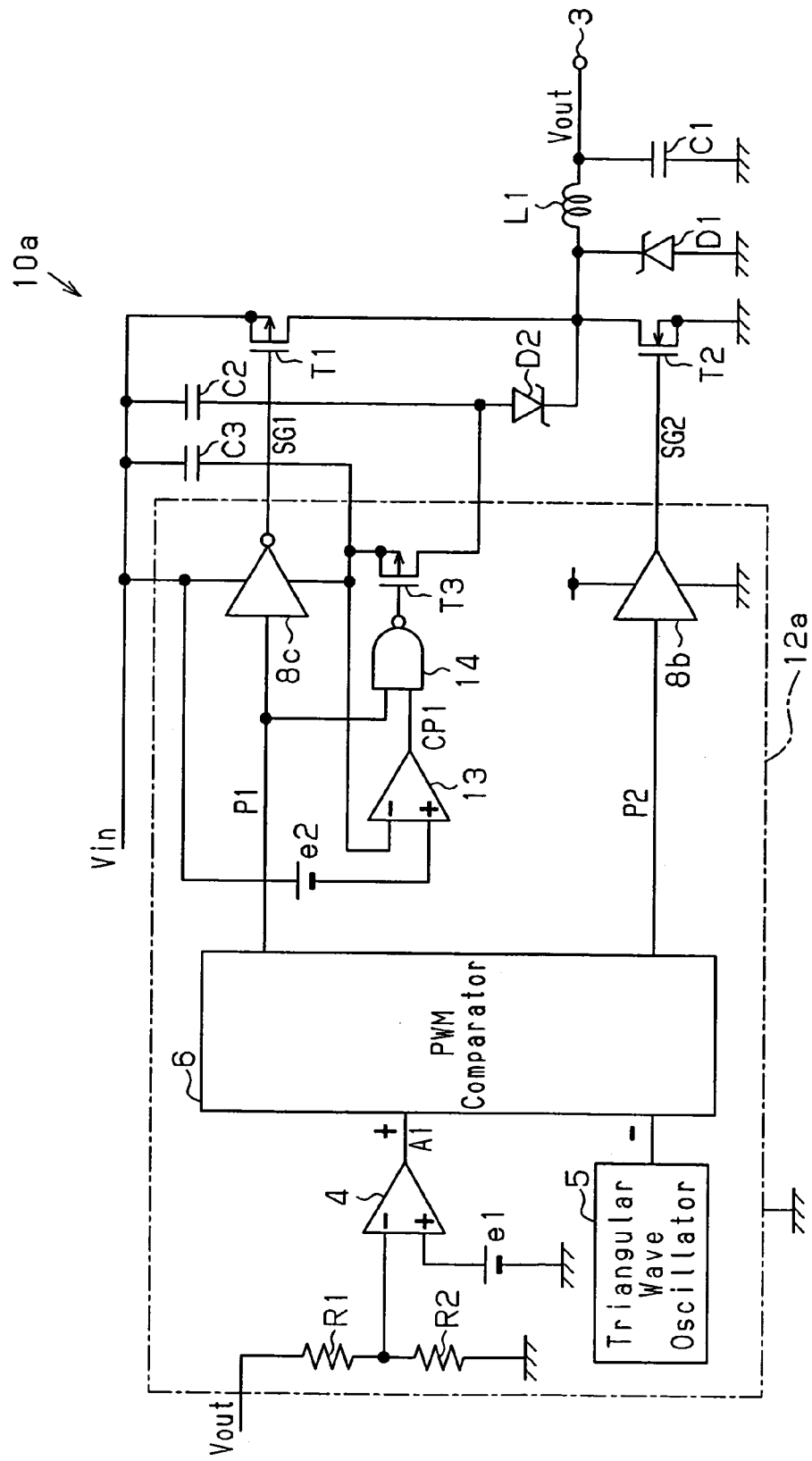
FIG. 8 is a schematic circuit diagram of a DC-DC converter according to a second embodiment of the present invention.

FIG. 8 is a schematic circuit diagram of a DC-DC converter 10a according to a second embodiment of the present invention. The DC-DC converter 10a will now be discussed centering on parts differing from the first embodiment.

Referring to FIG. 8, the main transistor T1 of the DC-DC converter 10a is a p-type FET in the second embodiment. In this case, the main transistor T1 is driven by a gate voltage that is lower than the input voltage Vin. When the gate voltage decreases to the ground potential, power loss resulting from the gate capacitance occurs in a manner proportional to the square of the voltage. Thus, in the DC-DC converter 10a, the main switching transistor T1 is driven by a proper voltage that is slightly lower than the input voltage Vin.

More specifically, the capacitor C2 and the diode D2 are connected between the source and drain of the main transistor T1. The cathode of the diode D2 is connected to the drain of the main transistor T1. The anode of the diode D2 is connected to the capacitor C2. The source of the main transistor T1 is connected to a control circuit 12a via the capacitor C3.

The control circuit 12a includes voltage dividing circuits R1 and R2, an error amplifier 4, a triangular wave oscillator 5, a PWM comparator 6, a drive circuit 8b, a transistor T3, a voltage comparator 13, and a NAND circuit 14. To drive the main transistor T1, the control circuit 12a includes a drive circuit (specifically, an inverter circuit) 8c in lieu of the drive circuit 8a of the first embodiment.

In the control circuit 12a, the drain of the transistor T3 is connected to a connection node between the anode of the diode D2 and the capacitor C2, and the source of the transistor T3 is connected to the capacitor C3. When the transistor T3 is activated, the capacitor C2 and the capacitor C3 are connected in parallel to each other.

The source of the transistor T3 is connected to a power supply terminal at the low potential side of the drive circuit 8c and to the inverting input terminal of the voltage comparator 13. Accordingly, the inverting input terminal of the voltage comparator 13 is supplied with the voltage of the capacitor C3 (i.e., the drive voltage of the drive circuit 8a). The non-inverting input terminal of the voltage comparator 13 is supplied with the reference voltage e2.

The voltage comparator 13 compares the voltage of the capacitor C3 to the reference voltage e2. When the voltage of the capacitor C3 is less than the reference voltage e2, the voltage comparator 13 generates the comparison output signal CP1 at a high level. When the voltage of the capacitor C3 is greater than the reference voltage e2, the voltage comparator 13 generates the comparison output signal CP1 at a low level. The comparison output signal CP1 is provided to one of the input terminals of the NAND circuit 14. The other one of the input terminals of the NAND circuit 14 is provided with the PWM output signal P1. The NAND output signal is provided to the gate of the transistor T3.

When the PWM output signal P1 is high and the comparison output signal CP1 is high, the NAND circuit 14 generates the NAND output signal at a low level. The transistor T3 is activated by the low NAND output signal. This connects the capacitors C2 and C3 in parallel to each other. The NAND circuit 14 generates the NAND output signal at a high level when the PWM output signal P1 or the comparison output signal CP1 is low. The high NAND output signal inactivates the transistor T3. This disconnects the capacitors C2 and C3 from each other.

In the second embodiment, the gate voltage generation circuit includes the diode D2, the capacitors C2 and C3, the transistor T3, the voltage comparator 13, and the NAND circuit 14.

Figure 9A:
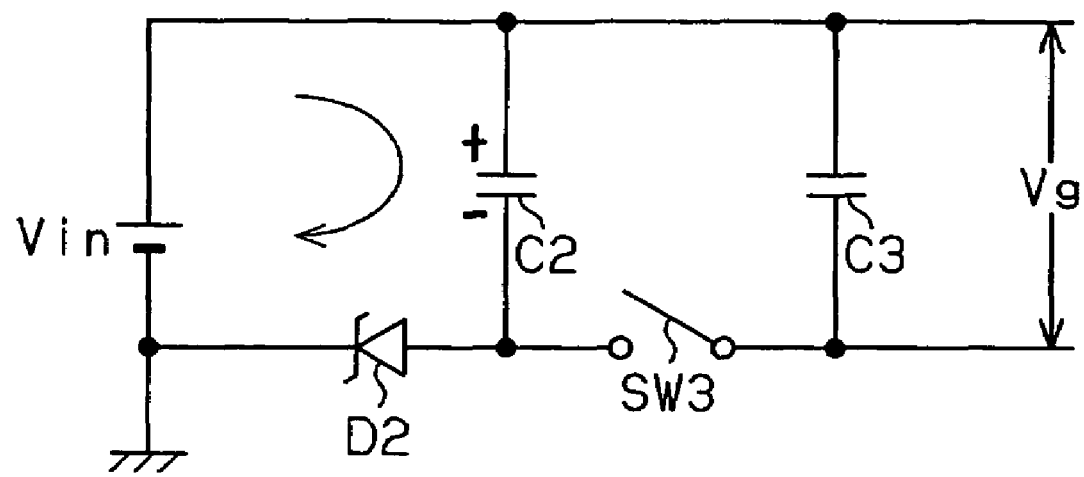
FIG. 9 is an equivalent circuit diagram illustrating the operation of the DC-DC converter shown in FIG. 8.
Figure 9B:
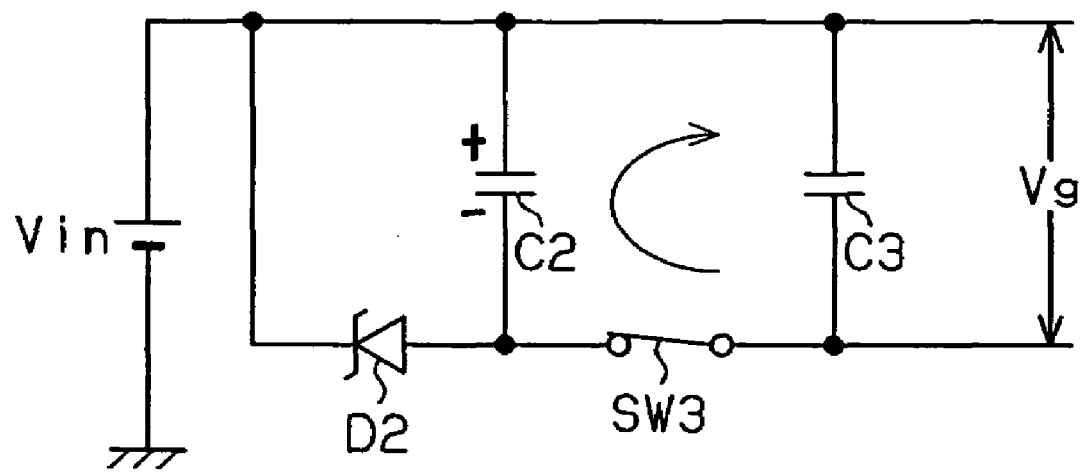

The operation of the DC-DC converter 10a will now be discussed with reference to the equivalent circuits of FIGS. 9(a) and 9(b). FIG. 9(a) is an equivalent circuit showing a state in which the main transistor T1 is inactivated and the rectifying transistor T2 is activated. FIG. 9(b) is an equivalent circuit showing a state in which the main transistor T1 is activated and the rectifying transistor T2 is inactivated. In FIGS. 9(a) and 9(b), the switch SW3 corresponds to the transistor T3.

In FIG. 9(a), the drain potential at the main transistor T1 is the ground potential. The capacitor C2 is grounded via the diode D2. Thus, the capacitor C2 is charged via the diode D2. In this state, the switch SW3 is inactivated, and the capacitor C3 is disconnected from the entire circuit.

In FIG. 9(b), the drain potential at the main transistor T1 is the input voltage Vin, and reversed bias is applied to the diode D2. When the switch SW3 is activated, the capacitors C2 and C3 are connected in parallel to each other. This charges the capacitor C3 with the capacitor C2.

In this case, in the same manner as the first embodiment, the gate voltage Vg at the output side is obtained from the next equation.

$$Vg = Ca2/(Ca2+Ca3) \times Vin$$

The difference between the capacitance Ca2 of the capacitor C2 connected to the input side and the capacitance Ca3 of the capacitance C3 connected to the output side is used to convert the input voltage Vin to the desired gate voltage Vg.

The DC-DC converter 10a of the second embodiment that uses a p-type FET is used in lieu of an n-type FET as the main transistor T1 has the same advantages as the DC-DC converter 10 of the first embodiment.

It should be apparent to those skilled in the art that the present invention may be embodied in many other specific forms without departing from the spirit or scope of the invention. Particularly, it should be understood that the present invention may be embodied in the following forms.

Figure 10:
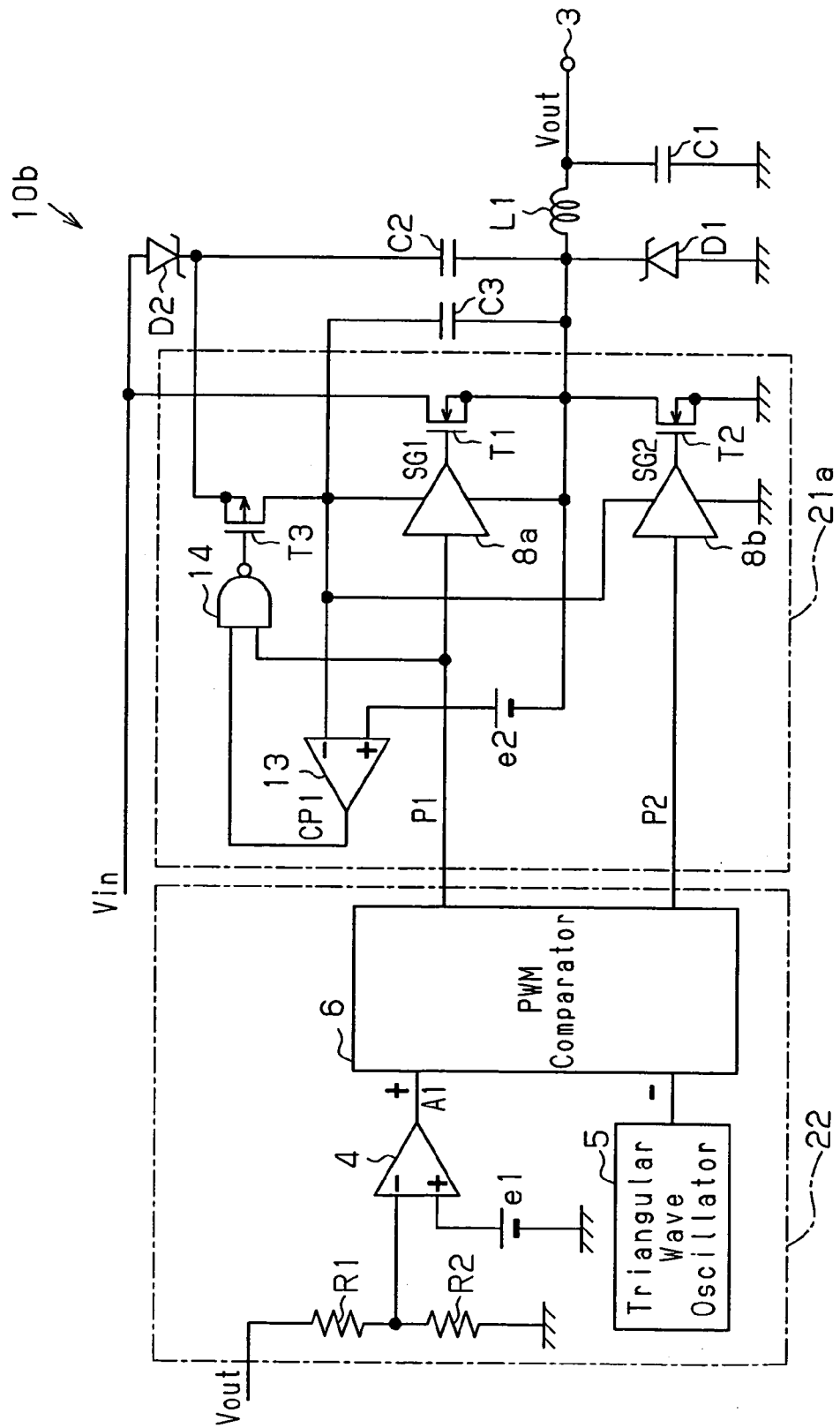
FIG. 10 is a schematic circuit diagram of another DC-DC converter.
Figure 11:
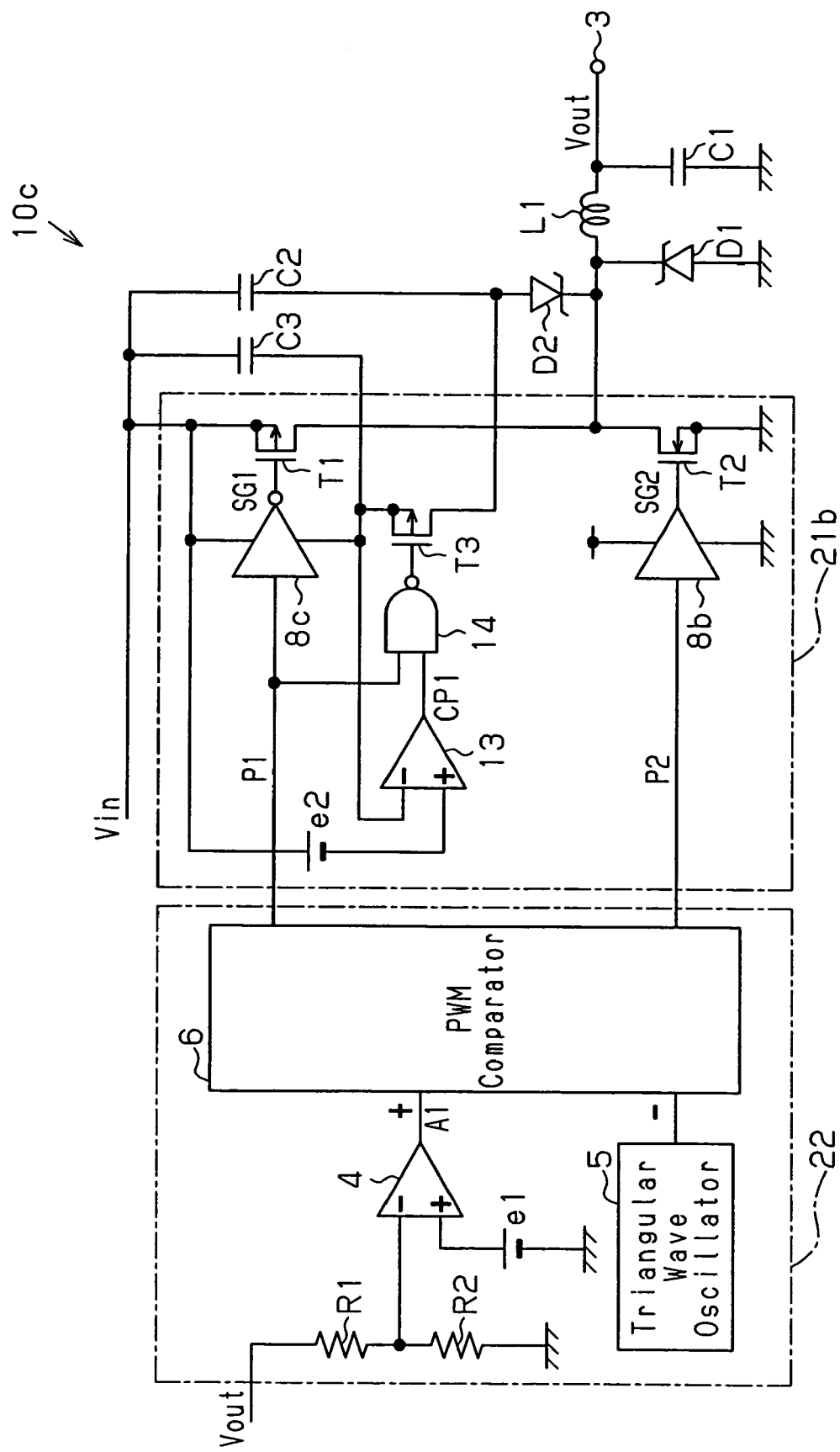
FIG. 11 is a schematic circuit diagram of a further DC-DC converter.

Referring to FIG. 10 showing a DC-DC converter 10b and FIG. 11 showing a DC-DC converter 10c, a gate voltage generation circuit may be configured on a semiconductor device 21a or 21b that includes a main transistor T1.

More specifically, for example, the DC-DC converter 10b of FIG. 10 includes the semiconductor device 21a, a control circuit 22, a choke coil L1, which is an externally connected device, a flywheel diode D1, a smoothing capacitor C1, a diode D2, and capacitors C2 and C3. In addition to the main transistor T1, the semiconductor device 21a includes a rectifying transistor T2, drive circuits 8a and 8b, and the gate voltage generation circuit (voltage comparator 13, NAND circuit 14, and transistor T3).

The DC-DC converter 10c of FIG. 11 includes the semiconductor device 21b, a control circuit 22, a choke coil L1, which is an externally connected device, a flywheel diode D1, a smoothing capacitor C1, a diode D2, and capacitors C2 and C3. In addition to the main transistor T1, the semiconductor device 21b includes a rectifying transistor T2, drive circuits 8c and 8b, and the gate voltage generation circuit (voltage comparator 13, NAND circuit 14, and transistor T3).

In each of the DC-DC converters 10b and 10c, the control circuit 22 includes voltage dividing resistors R1 and R2, an error amplifier 4, a triangular wave oscillator 5, and a PWM comparator 6.

The operation of the DC-DC converter 10b is the same as that of the DC-DC converter 10 of the first embodiment. The operation of the DC-DC converter 10c is the same as that of the DC-DC converter 10a of the second embodiment.

In the DC-DC converters 10b and 10c, in addition to the main switching transistor T1, a circuit for generating the gate voltage Vg (i.e., the transistor T3, the voltage comparator 13, and the NAND circuit 14) is connected to the single chip semiconductor device 21a to 21b.

In each embodiment, the voltage dividing resistors R1 and R2 may be arranged outside the control circuits 12, 12a, and 22. In this case, the resistances of the voltage dividing circuits R1 and R2 may be changed to adjust the output voltage of the DC-DC converter to a desired value.

The present invention is required only to be embodied in a switching regulator type DC-DC converter. For example, in the DC-DC converter 10 of the first embodiment, the drive circuit 8b and the rectifying circuit T2 may be eliminated.

In each embodiment, the capacitor C2 may be connected in parallel to the capacitor C3 via the transistor T3. In other words, the transistor T3 may be closer to the capacitor C2 than the capacitor C3.

The present examples and embodiments are to be considered as illustrative and not restrictive, and the invention is not to be limited to the details given herein, but may be modified within the scope and equivalence of the appended claims.

What is claimed is:

1. A method for controlling a DC-DC converter, wherein the DC-DC converter includes a first capacitor, a second capacitor, a diode connected in series with the first capacitor, and a main switching transistor having a source, a gate, and a drain, the method comprising:
    connecting the diode and the first capacitor that are connected in series with each other between the source and the drain of the main switching transistor;
    activating and inactivating the main switching transistor;
    generating gate voltage to drive the main switching transistor by connecting the second capacitor in parallel to the first capacitor or by disconnecting the second capacitor from the first capacitor in synchronism with the activation and inactivation of the main switching transistor;
    switching the main switching transistor with the gate voltage;
    monitoring the voltage of the second capacitor; and
    controlling the connection and disconnection of the first capacitor and the second capacitor in accordance with the monitored voltage of the second capacitor.

2. The method according to claim 1, wherein the DC-DC converter further includes a driver circuit for driving the main switching transistor, the method further comprising:
    disconnecting the first capacitor and the second capacitor when the main switching transistor is inactivated to charge the first capacitor via the diode with input voltage supplied to the main switching transistor;
    connecting the first capacitor and the second capacitor in parallel to each other when the main switching transistor is activated to charge the second capacitor with the first capacitor; and
    supplying the voltage of the charged second capacitor to the driver circuit as drive voltage of the driver circuit.

3. The method according to claim 1, wherein the DC-DC converter includes a synchronous rectification transistor connected in series to the main switching transistor, the method further comprising:
    inactivating the synchronous rectification transistor when the main switching transistor is activated, and activating the synchronous rectification transistor when the main switching transistor is inactivated.

4. The method according to claim 1, wherein:
    each of the first and second capacitors includes a first terminal and a second terminal;
    the first terminal of the first capacitor is connected to the diode, the second terminal of the first capacitor is connected to the second terminal of the second capacitor; and
    said generating gate voltage includes connecting and disconnecting the first terminal of the first capacitor and the first terminal of the second capacitor.

5. A DC-DC converter comprising:
    a main switching transistor having a source, a gate, and a drain; and
    a gate voltage generation circuit connected to the main switching transistor to generate gate voltage for driving the main switching transistor, the gate voltage generation circuit including:
        a series-connected circuit configured by a diode and a first capacitor connected between the source and the drain of the main switching transistor;
        a switch circuit connected to the first capacitor;
        a second capacitor connected in parallel to the first capacitor via the switch circuit, wherein the gate voltage generation circuit generates the gate voltage by connecting or disconnecting the first and second capacitors in synchronism with activation and inactivation of the main switching transistor;
        a voltage monitoring circuit connected to the second capacitor for monitoring the voltage of the second capacitor to generate a monitoring signal; and
        a switch control circuit connected to the voltage monitoring circuit and the switch circuit to activate and inactivate the switch circuit in accordance with the monitoring signal.

6. The DC-DC converter according to claim 5, further comprising:
    a drive circuit connected to the main switching transistor, the second capacitor, and the switch circuit to drive the main switching transistor, wherein:
    the first capacitor is charged via the diode with input voltage supplied to the main switching transistor when the main switching transistor is inactivated; and
    the second capacitor connected in parallel to the first capacitor by the switch circuit is charged by the first capacitor when the main switching transistor is activated to generate charged voltage that is supplied to the drive circuit as drive voltage.

7. The DC-DC converter according to claim 6, further comprising:
    a synchronous rectification transistor connected in series to the main switching transistor and switched with the main switching transistor in a complementary manner.

8. A DC-DC converter for converting an input voltage to a desired voltage, the DC-DC converter comprising:
    a main switching transistor having a source, a gate, and a drain;
    a first capacitor and a second capacitor connected between the source and the drain of the main switching transistor to divide the input voltage;
    a switch circuit connected to the first capacitor; and
    a drive voltage generation circuit for generating drive voltage for the main switching transistor with the input voltage divided by the first capacitor and the second capacitor;
    a voltage monitoring circuit connected to the second capacitor for monitoring the voltage of the second capacitor to generate a monitoring signal; and
    a switching control circuit connected to the voltage monitoring circuit and the switch circuit to activate and inactivate the switch circuit in accordance with the monitoring signal.

9. A DC-DC converter for converting an input voltage to a desired voltage, the DC-DC converter comprising:
    a main switching transistor having a source, a gate, and a drain;
    a first capacitor connected between the source and the drain of the main switching transistor to generate first charged voltage with the input voltage;
    with a switch circuit connected to the first capacitor;
    a second capacitor selectively connected to the first capacitor and charged by the first charged voltage to generate second charged voltage;
    a drive voltage generation circuit for generating drive voltage for the main switching transistor with the second charged voltage;

a voltage monitoring circuit for monitoring the second charged voltage to generate a monitoring signal; and a switch control circuit connected to the voltage monitoring circuit and the switch circuit to activate and inactivate the switch circuit in accordance with the monitoring signal.

10. The DC-DC converter according to claim 9, wherein the the switch circuit is connected between the first capacitor and the second capacitor, the switch circuit selectively connecting the second capacitor to the first capacitor in synchronism with activation and inactivation of the main switching transistor.

11. The DC-DC converter according to claim 9, further comprising:

a synchronous rectification transistor connected in series to the main switching transistor and switched with the main switching transistor in a complementary manner.

12. A semiconductor device for a DC-DC converter, wherein the DC-DC converter includes:

a main switching transistor having a source, a gate, and a drain;

a series-connected circuit configured by a diode and a first capacitor connected between the source and the drain of the main switching circuit; and a second capacitor connected to the first capacitor, the semiconductor device comprising:
 a switch circuit connected between the first capacitor and the second capacitor, the switch circuit connecting or disconnecting the first and second capacitors in synchronism with activation and inactivation of the main switching transistor to generate gate voltage for the main switching transistor;
 a drive signal generation circuit connected to the switch circuit to generate a drive signal of the main switching transistor;
 a drive circuit connected to the main switching transistor, the second capacitor, and the switch circuit to drive the main switching transistor, wherein the drive circuit receives the gate voltage from the second capacitor as drive voltage of the drive circuit;
 a voltage monitoring circuit connected to the second capacitor to monitor the voltage of the second capacitor and generate a monitoring signal; and
 a switch control circuit connected to the voltage monitoring circuit and the switch circuit to activate and inactivate the switch circuit in accordance with the monitoring signal.

13. The semiconductor device according to claim 12, wherein the drive signal generation circuit includes:

a voltage dividing resistor for dividing output voltage of the DC-DC converter to generate divisional voltage;

an error amplifier connected to the voltage dividing resistor to amplify the difference between the divisional voltage and a reference voltage to generate an error amplification signal;

a triangular wave oscillator for generating a triangular wave signal; and a PWM comparator connected to the error amplifier and the triangular wave oscillator to compare the triangular wave signal with the error amplification signal and generate a PWM signal as the drive signal.

14. A semiconductor device for a DC-DC converter, wherein the DC-DC converter includes:

a series-connected circuit configured by a diode and a first capacitor; and a second capacitor connected to the first capacitor, the semiconductor device comprising:
 a main switching transistor connected to the first capacitor and the second capacitor and having a source, a gate, and a drain, wherein the series-connected circuit is connected between the source and the drain of the main switching transistor; and
 a switch circuit connected between the first capacitor and the second capacitor, the switch circuit connecting or disconnecting the first and second capacitors in synchronism with activation and inactivation of the main switching transistor to generate gate voltage for the main switching transistor;
 a drive circuit connected to the main switching transistor, the second capacitor, and the switch circuit to drive the main switching transistor, wherein the drive circuit receives the gate voltage from the second capacitor as drive voltage of the drive circuit;
 a voltage monitoring circuit connected to the second capacitor to monitor the voltage of the second capacitor and generate a monitoring signal; and
 a switch control circuit connected to the voltage monitoring circuit and the switch circuit to activate and inactivate the switch circuit in accordance with the monitoring signal.

15. The DC-DC converter according to claim 14, further comprising:

a synchronous rectification transistor connected in series to the main switching transistor and switched with the main switching transistor in a complementary manner.

16. An electronic device comprising:

a DC-DC converter including:
 a main switching transistor having a source, a gate, and a drain; and
 a gate voltage generation circuit connected to the main switching transistor to generate gate voltage for driving the main switching transistor, the gate voltage generation circuit including:
 a series-connected circuit configured by a diode and a first capacitor connected between the source and the drain of the main switching transistor;
 a switch circuit connected to the first capacitor;
 a second capacitor selectively connected in parallel to the first capacitor via the switch circuit, wherein the gate voltage generation circuit generates the gate voltage by connecting or disconnecting the second capacitor between the first and second nodes in synchronism with activation and inactivation of the main switching transistor
 a voltage monitoring circuit connected to the second capacitor for monitoring the voltage of the second capacitor to generate a monitoring signal; and
 a switch control circuit connected to the voltage monitoring circuit and the switch circuit to activate and inactivate the switch circuit in accordance with the monitoring signal.

17. The electronic device according to claim 16, wherein the DC-DC converter further includes:

a synchronous rectification transistor connected in series to the main switching transistor and switched with the main switching transistor in a complementary manner.

* * * * *

UNITED STATES PATENT AND TRADEMARK OFFICE
CERTIFICATE OF CORRECTION

PATENT NO. : 7,098,639 B2
APPLICATION NO. : 10/716401
DATED : August 29, 2006
INVENTOR(S) : Masahiro Natsume et al.

It is certified that error appears in the above-identified patent and that said Letters Patent is hereby corrected as shown below:

Column 15, line 8, after "the" delete the paragraph break

Column 15, line 8, delete "the" second occurrence

Column 16, line 49, after "transistor" insert --;--

Signed and Sealed this

First Day of May, 2007

JON W. DUDAS
*Director of the United States Patent and Trademark Office*